(12) United States Patent
Platow et al.

(10) Patent No.: US 11,545,330 B2
(45) Date of Patent: Jan. 3, 2023

(54) ION SOURCE WITH MULTIPLE BIAS ELECTRODES

(71) Applicant: Axcelis Technologies, Inc., Beverly, MA (US)

(72) Inventors: Wilhelm Platow, Newburyport, MA (US); Paul Silverstein, Arlington, MA (US); Neil Bassom, Hamilton, MA (US); Marvin Farley, Ipswich, MA (US); David Sporleder, Billerica, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 17/318,325

(22) Filed: May 12, 2021

(65) Prior Publication Data

US 2022/0367138 A1     Nov. 17, 2022

(51) Int. Cl.
*H01J 27/02* (2006.01)
*H01J 27/08* (2006.01)

(52) U.S. Cl.
CPC ............ *H01J 27/024* (2013.01); *H01J 27/08* (2013.01)

(58) Field of Classification Search
CPC ................................ H01J 27/024; H01J 27/08
See application file for complete search history.

(56) References Cited

U.S. PATENT DOCUMENTS

| | | | |
|---|---|---|---|
| 8,330,127 B2 | 12/2012 | Low | |
| 9,691,584 B1 | 6/2017 | Tieger | |
| 2009/0242793 A1 | 10/2009 | Low et al. | |
| 2018/0254166 A1 | 9/2018 | Kawaguchi | |
| 2019/0122851 A1 | 4/2019 | Tieger et al. | |

OTHER PUBLICATIONS

Bogomolov, S.L et al.; The production of ions of solids from the PIG source with an additional anode; Review of Scientific Instruments; Mar. 1996.
Dudnikov, V. et al.; "Small Anode Source for Efficient Ion Production"; Fermilab; Pub 02/155-E; Jul. 2002.
Chen, Francis et al.; "Principles of Plasma Processing" University of California, Los Angeles; Plenum Kulwer Publishers; 2002.
International Search Report and Written Opinion dated Aug. 11, 2022 for International Application No. PCT/US2022/028786.

*Primary Examiner* — Joseph L Williams
(74) *Attorney, Agent, or Firm* — Eschweiler & Potashnik, LLC

(57) ABSTRACT

An ion source has an arc chamber having first and second ends and an aperture plate to enclose a chamber volume. An extraction aperture is disposed between the first and second ends. A cathode is near the first end of the arc chamber, and a repeller is near the second end. A generally U-shaped first bias electrode is on a first side of the extraction aperture within the chamber volume. A generally U-shaped second bias electrode is on a second side of the extraction aperture within the chamber volume, where the first and second bias electrodes are separated by a first distance proximate to the extraction aperture and a second distance distal from the extraction aperture. An electrode power supply provides a first and second positive voltage to the first and second bias electrodes, where the first and second positive voltages differ by a predetermined bias differential.

20 Claims, 8 Drawing Sheets

ION SOURCE WITH MULTIPLE BIAS ELECTRODES

TECHNICAL FIELD

The present invention relates generally to ion implantation systems, and more specifically to an ion source having an improved current, efficiency, and lifetime by utilizing multiple bias electrodes.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energizes and directs the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining or improving desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources (commonly referred to as arc ion sources) generate ion beams used in implanters and can include heated filament cathodes for creating ions that are shaped into an appropriate ion beam for wafer treatment. U.S. Pat. No. 5,497,006 to Sferlazzo et al., for example, discloses an ion source having a cathode supported by a base and positioned with respect to a gas confinement chamber for ejecting ionizing electrons into the gas confinement chamber. The cathode of the Sferlazzo et al. is a tubular conductive body having an endcap that partially extends into the gas confinement chamber. A filament is supported within the tubular body and emits electrons that heat the endcap through electron bombardment, thereby thermionically emitting ionizing electrons into the gas confinement chamber.

Conventionally, the filament is located at one side of the chamber. In many popular ion sources, an indirectly heated cathode (IHC) is implemented, wherein a tungsten cap is positioned over the filament, and whereby the filament heats the cap, while the cap protects the filament in order to increase a lifetime of the ion source. The cap or cathode, however is sputtered away over time. As such, the thickness of cap is made large, whereby the filament is heated to high temperatures to emit a substantial amount lot of electrons. The cap in this instance thus acts like a filament to emit electrons, but because of its significant thickness, a longer life has been attainable.

One or more bias electrodes have been further provided within ion source chambers to increase beam currents in extracted ion beams at higher charge states. Various configurations of ion source chambers having bias electrodes have been previously provided, such as those described in U.S. Pat. No. 8,330,127 to Low et al., U.S. Pat. No. 9,691,584 to Tieger et al., and US Patent Publication 2018/0254166 to Kawaguchi. However, such conventional arc chambers typically provide one or more of the bias electrodes as being grounded to the arc chamber.

In a circumstance where no bias electrodes are provided, the cathode is biased negatively with respect to the arc chamber, and therefore, electrons that are thermally emitted by the cathode are driven away from the negative potential and into the arc chamber. By adding the bias electrodes, a positive voltage attracts those electrons, and a lifetime of the cathode is increased by grounding the cathode and only biasing the bias electrodes. However, again, at least one of the bias electrodes have been grounded in conventional systems.

SUMMARY

The ion source is a primary component of an ion implantation system. As such, various metrics associated with the ion implantation system, such as throughput, uptime, glitch rate, as well as desired implantation parameters have an impact on the performance of the ion source. The present disclosure provides a plurality of independently-biased electrodes within the ion source, whereby increased beam current for multi-charged ions can be attained, while further facilitating other parameters associated with the ion source to be eased to advantageously increase a lifetime of the ion source.

The present disclosure thus provides a system and apparatus for increasing the efficiency and ion beam current produced by an ion source. This present disclosure provides at least two electrodes situated inside of an arc chamber of an ion source, whereby the at least two electrodes are each separately electrically biased. The ion source of the present disclosure is particularly advantageous for multiple-charged ion species, as the present disclosure can provide an ion beam current that is greater than twice the ion beam current of conventional ion sources. In addition, the ion source of the present disclosure provides an indirectly heated cathode (IHC) such that noise and so-called glitch rates are lowered, as compared to conventional IHC ion sources, whereby the ion source of the present disclosure can provide a balance of a desired beam current and increased lifetime associated with the ion source over conventional IHC ion sources.

Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion source is provided, wherein the ion source comprises an arc chamber having a first end and a second end opposite the first end. An aperture plate, for example, is operably coupled to the arc chamber, therein generally enclosing a chamber volume, wherein the aperture plate comprises an extraction aperture disposed between the first and second ends of the arc chamber. A cathode is disposed within the chamber volume proximate to the first end of the arc chamber, and a repeller (e.g., an anti-cathode) is disposed within the chamber volume proximate to the second end of the arc chamber. The cathode, for example, can comprise an indirectly heated cathode comprising a heater filament and a cap, wherein the heater filament is electrically coupled to a heater power supply configured to selectively energize and heat the cap.

A first bias electrode, for example, is disposed within the chamber volume on a first side of the extraction aperture, wherein the first bias electrode is generally U-shaped when viewed from the first end. Further, a second bias electrode is disposed within the chamber volume on a second side of the extraction aperture, wherein the second bias electrode is generally U-shaped when viewed from the first end. The first and second bias electrodes, for example, are separated by a first distance in a first region proximate to the extraction aperture. Further, the first and second bias electrodes are separated by a second distance in a second region distal from the extraction aperture.

An electrode power supply, for example, is further electrically coupled to the first bias electrode and second bias electrode and configured to provide a first positive voltage to the first bias electrode and a second positive voltage to the second bias electrode. The second positive voltage, for example, differs from the first positive voltage by a predetermined bias differential. The predetermined bias differential, for example, is on the order of approximately 10 volts.

In accordance with one example, the first and second bias electrodes extend a predetermined length between respective locations proximate to the first and second ends of the arc chamber. In another example, the first and second bias electrodes have an arcuate shape when viewed from the first end of the arc chamber.

In another example, first distance between the first and second bias electrodes is greater than the second distance. For example, the first distance is approximately twice the second distance. In another example, the first distance is greater than a width of the extraction aperture.

According to another example, each of the first and second bias electrodes comprise a respective bevel defining the first distance, wherein each bevel is associated with a line extending from a respective proximate edge of the extraction aperture toward the respective first and second electrodes.

In another example, the arc chamber further comprises a gas hole defined in a wall thereof. The gas hole, for example, is positioned between the first and second ends of the arc chamber proximate to the second region, wherein the gas hole is fluidly coupled to a gas source.

In accordance with another example, the electrode power supply comprises a first power supply and a second power supply. The first power supply, for example, is configured to provide the first positive voltage to the first bias electrode and the second power supply is configured to provide the second positive voltage to the second bias electrode. In another example, a resistive element is electrically coupled between the electrode power supply and the second bias electrode, wherein a resistance of the resistive element defines the predetermined bias differential. The resistive element, for example, can comprise a variable resistor having a selectively variable resistance.

Each of the first bias electrode and second bias electrode, for example, can respectively comprise a plate supported by one or more rods extending through a wall of the arc chamber. The one or more rods, for example, are clamped to a respective electrode clamp, wherein the respective clamp, one or more rods, and plate are electrically insulated from the arc chamber.

In accordance with another example aspect, an ion source is provided, wherein an arc chamber has a first arc chamber wall extending from a first end of the arc chamber to a second end of the arc chamber. The first wall, for example, has an extraction aperture defined therein that is positioned between the first and second ends of the arc chamber. An indirectly heated cathode, for example, is disposed proximate to the first end of the arc chamber, wherein the indirectly heated cathode comprises heater filament and cap, and wherein the heater filament is configured to receive electrical power to heat the cap.

A first bias electrode, for example, is disposed between the first and second ends of the arc chamber on a first side of the extraction aperture, wherein the first bias electrode is generally U-shaped when viewed from the first end. Further, a second bias electrode is disposed between the first and second ends of the arc chamber on a second side of the extraction aperture, wherein the second bias electrode is generally U-shaped when viewed from the first end. A resistive element, for example, is electrically coupled between the first bias electrode and the second bias electrode, wherein a resistance of the resistive element defines a predetermined bias differential between the first bias electrode and second bias electrode. The predetermined bias differential, for example, is on the order of approximately 10 volts.

In one example, the first bias electrode and second bias electrode are separated by a first distance in a first region proximate to the extraction aperture and by a second distance in a second region distal from the extraction aperture, wherein the first distance is greater than the second distance.

In yet another example, an electrode power supply is electrically coupled to the first bias electrode and second bias electrode and configured to provide a first positive voltage to the first bias electrode and a second positive voltage to the second bias electrode, wherein the second positive voltage differs from the first positive voltage by a predetermined bias differential.

In another aspect, a method is provided for increasing a beam current in an indirectly heated cathode (IHC) ion source. The method, for example, comprises electrically biasing an indirectly heated cathode disposed within an arc chamber, wherein the indirectly heated cathode is biased with respect to opposing first and second arc chamber walls, and wherein the first arc chamber wall comprises an extraction aperture positioned between first and second ends of the arc chamber. A first bias electrode is electrically biased with respect to a second bias electrode by a predetermined bias differential, wherein the first and second bias electrodes are disposed between the first and second ends of the arc chamber and are separated by a first gap proximate to the first arc chamber wall and a second gap proximate to the second arc chamber wall. Further, an ion beam is extracted through the extraction aperture, wherein the predetermined bias potential increases the beam current of the ion beam.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
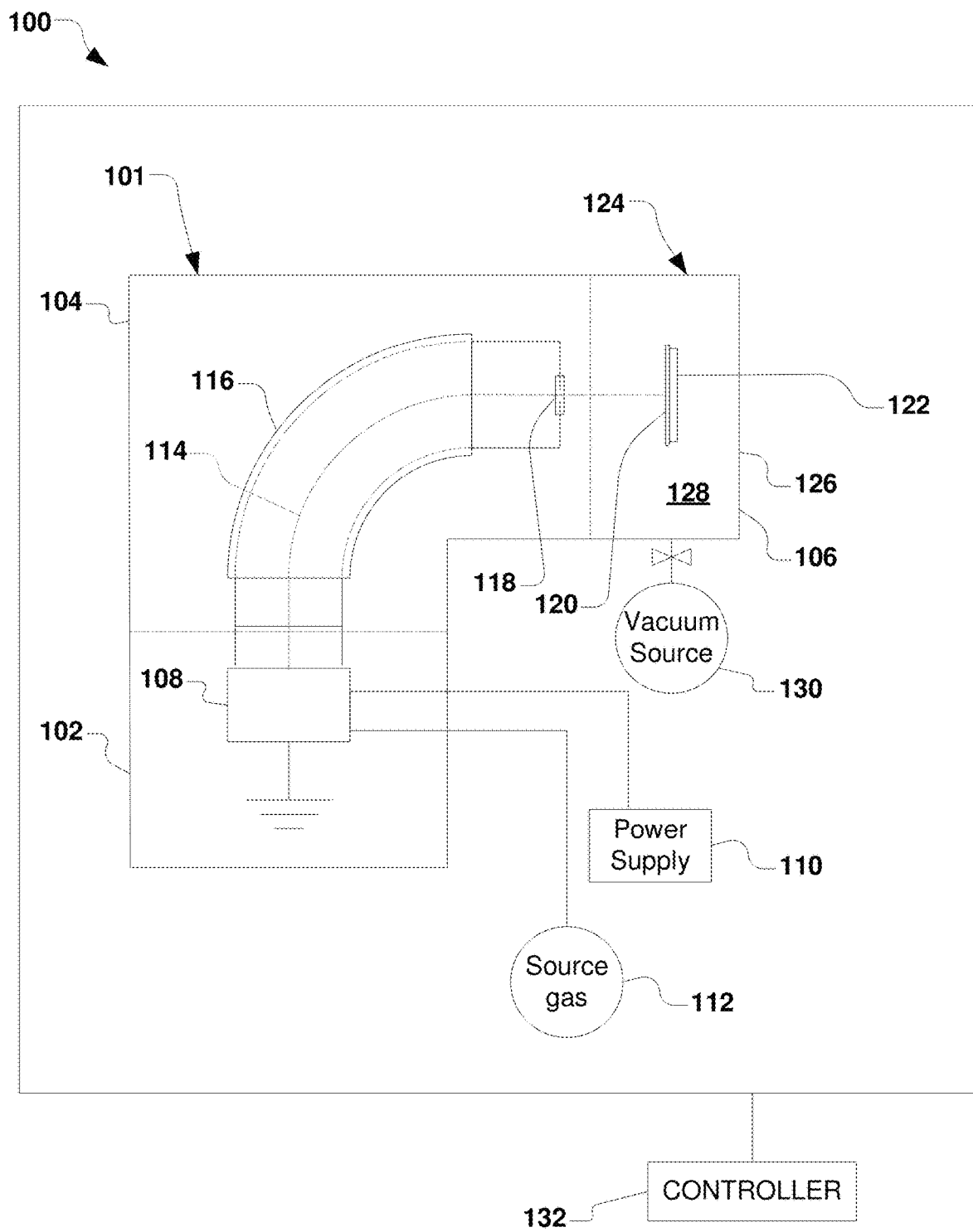
FIG. 1 is a block diagram of an exemplary vacuum system utilizing an ion source in accordance with several aspects of the present disclosure.

The present disclosure is directed generally toward an ion implantation system and an ion source associated therewith. More particularly, the present disclosure is directed toward a system and apparatus for increasing an ion beam current and lifetime of the ion source. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or components in one embodiment, and may also or alternatively be fully or partially implemented in a common feature or component in another embodiment.

In order to gain an appreciation of the present disclosure, FIG. 1 illustrates an exemplified vacuum system 100 that may implement various apparatus, systems, and methods of the present disclosure. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110, whereby a source gas 112 (also called a dopant gas) supplied thereto is ionized into a plurality of ions to form an ion beam 114. The ion beam 114 in the present example is directed through a beam-steering apparatus 116, and out an aperture 118 towards the end station 106. In the end station 106, the ion beam 114 bombards a workpiece 120 (e.g., a semiconductor such as a silicon wafer, a display panel, etc.), which is selectively clamped or mounted to a chuck 122 (e.g., an electrostatic chuck or ESC). Once embedded into the lattice of the workpiece 120, the implanted ions change the physical and/or chemical properties of the workpiece. Because of this, ion implantation is used in semiconductor device fabrication and in metal finishing, as well as various applications in materials science research.

The ion beam 114 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 124, such as a vacuum chamber 126, wherein a process environment 128 is associated with the process chamber. The process environment 128 within the process chamber 124, for example, comprises a vacuum produced by a vacuum source 130 (e.g., a vacuum pump) coupled to the process chamber and configured to substantially evacuate the process chamber. Further, a controller 132 is provided for overall control of the vacuum system 100.

The present disclosure provides an apparatus configured to increase beam current and utilization of the ion source 108 while decreasing downtime of the ion source in the ion implantation system 101 discussed above. It shall be understood that the apparatus of the present disclosure may be implemented in various semiconductor processing equipment such as CVD, PVD, MOCVD, etching equipment, and various other semiconductor processing equipment, and all such implementations are contemplated as falling within the scope of the present disclosure. The apparatus of the present disclosure further advantageously increases the length of usage of the ion source 108 between preventive maintenance cycles, and thus increases overall productivity and lifetime of the system vacuum 100.

The ion source 108, for example, plays a large role in the ion implantation system 101. As such, the performance of the ion source 108 can play a large role in metrics associated with the ion implantation system 101, such as throughput, uptime, glitch rate, as well as desired implantation parameters such as energy states of the desired ion species.

Figure 2A:
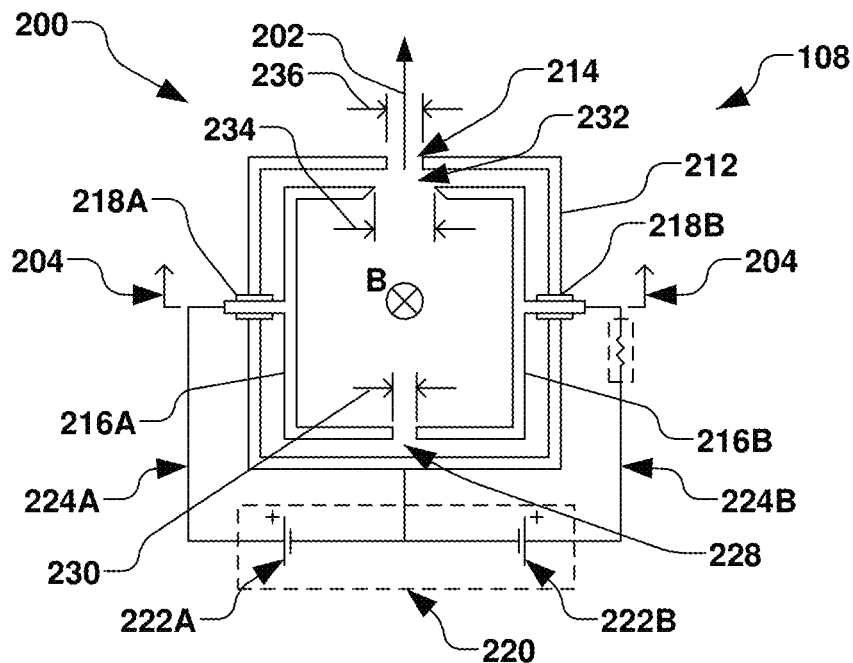
FIG. 2A is a block diagram of a top view of an example arc chamber in accordance with several aspects of the present disclosure.
Figure 2B:
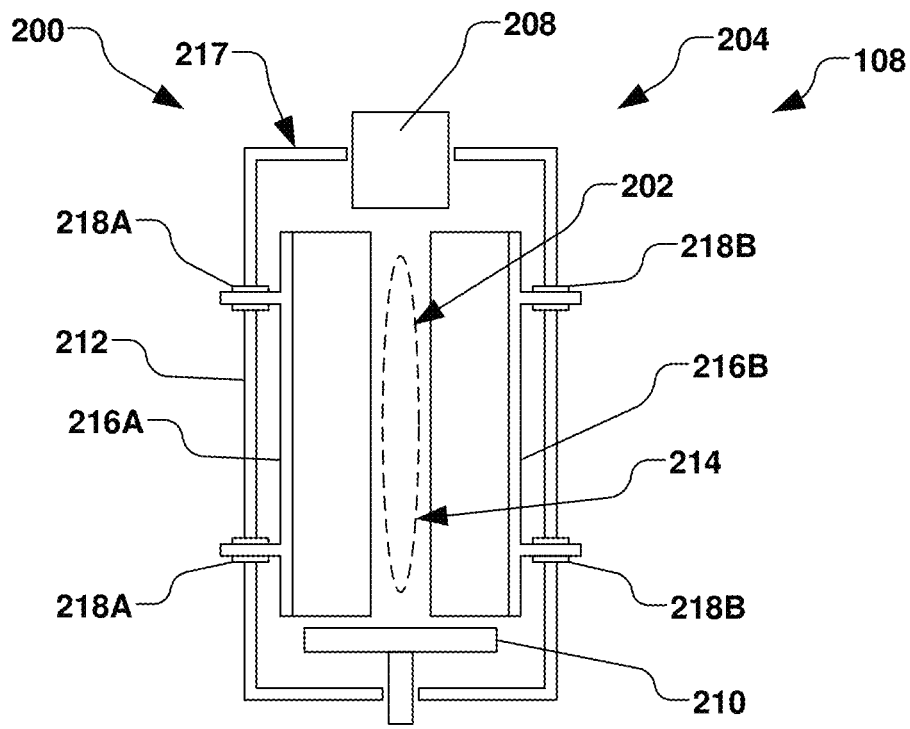
FIG. 2B is a block diagram of a side view of the example arc chamber in accordance with several aspects of the present disclosure.

Referring now to FIGS. 2A-2B, an exemplified hardware configuration and operational principal of the ion source 108 of FIG. 1 is provided in accordance with various aspects of the present disclosure. FIG. 2A, for example, illustrates of an ion source 200 for forming an ion beam 202, whereby FIG. 2B illustrates a cross section 204 perpendicular to the ion beam (e.g., the ion beam is directed into the page in FIG. 2B). The ion source 200 of the present example comprises various IHC components such as a cathode 208 and a repeller 210 disposed within an arc chamber 212, wherein the ion beam 202 is extracted through an extraction aperture 214. Accordingly, a magnetic field (e.g., shown in FIG. 2A as "B"), for example, can be applied in the long direction of the ion source 200 (e.g., into and out of the page in FIG. 2A) via the cathode 208 and repeller 210.

FIGS. 2A-2B further illustrate a pair of bias electrodes, identified as first and second bias electrodes 216A, 216B in the present example, wherein the pair of bias electrodes are generally U-shaped when viewed from an end 217 of the arc chamber 212 of FIG. 2B. The first and second bias electrodes 216A, 216B, for example, are electrically insulated from the arc chamber 212 via one or more electrical insulators 218A, 218B. In one example, the one or more electrical insulators 218A, 218B are provided external to the arc chamber 212, as will be discussed infra, whereby coating of the one or more insulators with the ion source material is generally mitigated, thus generally preventing electrical shorting of the bias electrodes 216A, 216B to the arc chamber.

As shown in FIG. 2A, for example, an electrode power supply 220 is provided and configured to positively bias each of the respective first and second bias electrodes 216A, 216B with respect to the arc chamber 212. For example, the electrode power supply 220 comprises a first power supply 222A and a second power supply 222B, wherein the first power supply and second power supply are electrically coupled to the respective first bias electrode 216A and second bias electrode 216B and configured to respectively provide a first positive voltage 224A to the first bias electrode and a second positive voltage 224B to the second bias electrode. In accordance with the present disclosure, the first positive voltage 224A differs from the second positive voltage 224B by a predetermined bias differential (e.g., 10V).

In one alternative example, the electrode power supply 220 can comprise a single bias power supply electrically connected to each of the first bias electrode 216A and second bias electrode 216B, whereby a resistor (not shown) having a fixed or variable resistance is connected between the first bias electrode and second bias electrode. As such, a voltage drop across the resistor can provide a fixed value for the predetermined bias differential in the case of the resistor being a fixed resistor, or the predetermined bias differential can be selectively varied in the case of the resistor being a variable resistor.

In accordance with the present disclosure, the first and second bias electrodes 216A, 216B are configured to be closely proximate to one another in a region 228 generally opposite to the extraction aperture 214. The present disclosure appreciates that the first and second bias electrodes 216A, 216B, being in close proximity to one another, such as by a first distance 230 (e.g., a gap of approximately a few millimeters) in the region 228 opposite to the extraction aperture 214, for example, can advantageously provide for increased ion beam currents over conventional ion sources.

In an extraction region 232 proximate to the extraction aperture 214, for example, the first and second bias electrodes 216A, 216B can be spaced by a second distance 234 therebetween, wherein the second distance is larger than the first distance 230. The second distance 234, for example, is approximately twice an extraction aperture width 236 of the extraction aperture 214. In one non-limiting example, for an extraction aperture width 236 of approximately 5 mm, the second distance 234 is approximately 10 mm.

In accordance with another aspect, the present disclosure contemplates independently (e.g., separately) biasing each of the first and second bias electrodes 216A, 216B to a respective positive first and second bias voltage above ground potential, whereby a beam current of the ion beam 202 is advantageously increased over conventional ion sources having at least one bias electrode that is grounded, or multiple bias electrodes having the same bias voltages applied thereto.

Figure 3:
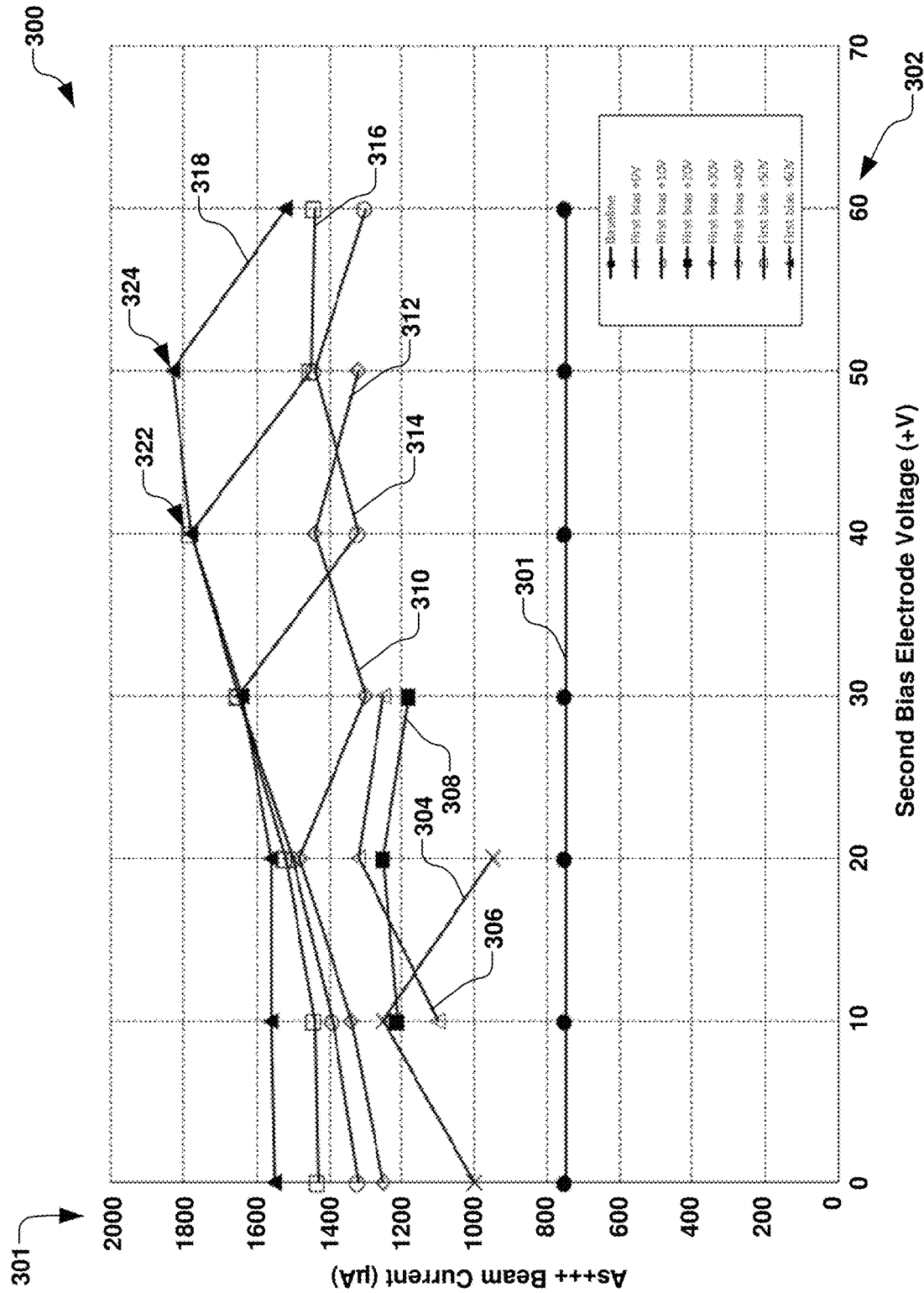
FIG. 3 is a graph illustrating various beam currents achieved using various bias voltage differentials between bias electrodes in accordance with several aspects of the present disclosure.

FIG. 3 illustrates a graph 300 showing ion beam currents achieved in an example arsenic triple-charged (i.e., $As^{+++}$ or $As^{3+}$) ion beam in accordance with various aspects of the present disclosure. The graph 300, for example, illustrates the ion beam current 301 of an ion beam that is extracted from an ion source relative to a range of bias electrode voltages 302. A baseline 303 is provided for comparison using a conventional IHC ion source, whereby a constant ion beam current 301 can be seen when both electrodes are electrically grounded. In contrast, the ion beam currents 301 associated with a respective plurality of first bias electrode voltages 304, 306, 308, 310, 312, 314, 316, 318 applied to the first bias electrode 216A of FIGS. 2A-2B can be seen in FIG. 3 when the second bias electrode 216B is energized at various second bias electrode voltages 302 ranging from 0V to +60V.

A can be seen in FIG. 3, for example, first bias electrode voltage 316 represents a voltage potential bias of +50V applied to the first bias electrode 216A over the range of second bias electrode voltages 302, whereby a maximum or peak 322 is seen in the ion beam current 301 (e.g., approximately 1790 uA) when the second bias electrode voltage potential is biased at approximately +40V, whereby the voltage potential differential between the first and second bias electrodes is approximately 10V.

In another example, first bias electrode voltage 318 of FIG. 3 yields a maximum or peak 324 in the ion beam current 301 (e.g., approximately 1820 uA) that is attained when the first bias electrode 216A of FIGS. 2A-2B is being positively biased at +60V, while the second bias electrode 216B is positively biased at +50V, whereby the voltage potential differential between the first and second bias electrodes is, again, approximately 10V. Similar 10V potential differentials yielding maximum ion beam currents are likewise seen in the various other voltage schemes applied to the first and second bias electrode 216A, 216B, such as evidenced by a so-called E×B drift effect that moves ions from the plasma to the extraction aperture 214.

FIG. 3 thus illustrates experimental results of an example of the present disclosure where maximum beam currents can be achieved when the first bias electrode 216A and second bias electrode 216B of FIGS. 2A-2B have a potential difference of approximately 10V. The present disclosure has shown in other experiments that tuning various other ion source parameters (e.g., source magnet power, gas flow rates, etc.), with the first bias electrode voltage of +55V and second bias electrode voltage of +45V, for example, could yield optimal maximum ion beam currents for an As+++ ion beam, whereby increasing voltages beyond these values generally resulted in diminishing returns.

The present disclosure further appreciates that providing differential biasing of the first and second bias electrodes 216A, 216B utilizing other ion species (e.g., $As^{2+}$, $As^{4+}$, $B^{2+}$, $B^{3+}$, $P^{2+}$, $P^{3+}$ etc.) advantageously provides an increase in ion beam currents in the range 1.5-3.5 times over ion beam currents in conventional systems having either no bias electrodes, bias electrodes that are equally biased, or having one bias electrode that is grounded. The present disclosure thus contemplates a predetermined differential biasing of the first and second bias electrodes 216A, 216B, whereby both of the first and second electrodes are positively biased, is an unforeseen and novel discovery.

The present disclosure thus provides the pair of bias electrodes 216A, 216B that are respectively configured to be individually positively biased by the predetermined bias differential, and whereby an increase in ion beam current can be achieved with multiple-charged ions, such as arsenic triple-charged ($As^{3+}$). In contrast to an electrical grounding of the first bias electrode 216A (e.g., grounded to the arc chamber 212) and a positive biasing of the second bias electrode 216B, the present disclosure provides an electrical bias to both of the first bias electrode and second bias electrode, such that the predetermined bias differential is provided between the first and second bias electrodes, wherein both first and second electrodes are positively biased with respect to electrical ground. In one preferred embodiment, the predetermined bias differential of approximately 10V can be provided between the first and second bias electrodes 216A, 216B while providing a positive arc voltage (e.g., 100V) to the cathode 208 in order to provide a higher ion beam currents than those conventionally seen.

Figure 4:
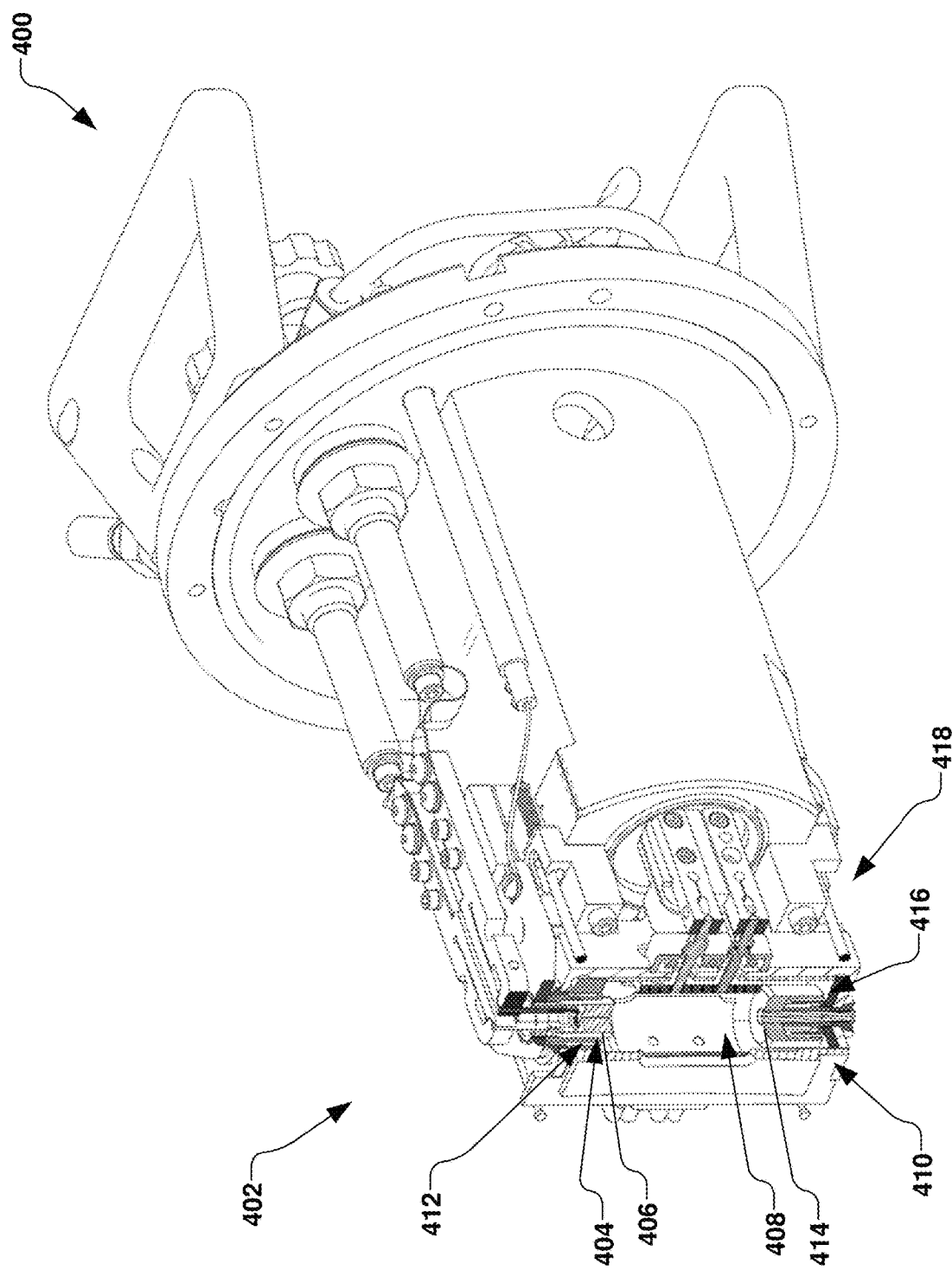
FIG. 4 illustrates a perspective view of an ion source in accordance with various aspects of the present disclosure.

FIG. 4 illustrates an example ion source 400, whereby various further aspects of the disclosure will be appreciated. The ion source 400, for example, comprises an IHC ion source 402, where a cathode 404, such as an indirectly heated cathode 406 is positioned within a chamber volume 408 of an arc chamber 410 for the generation of ions of a desired species, therein. The cathode 404, for example, is positioned proximate to a first end 412 of the arc chamber 410. A repeller 414 is disposed within the chamber volume 408 proximate to a second end 416 of the arc chamber 410, where in the present example, the second end is generally opposite the first end 412.

Figure 5:
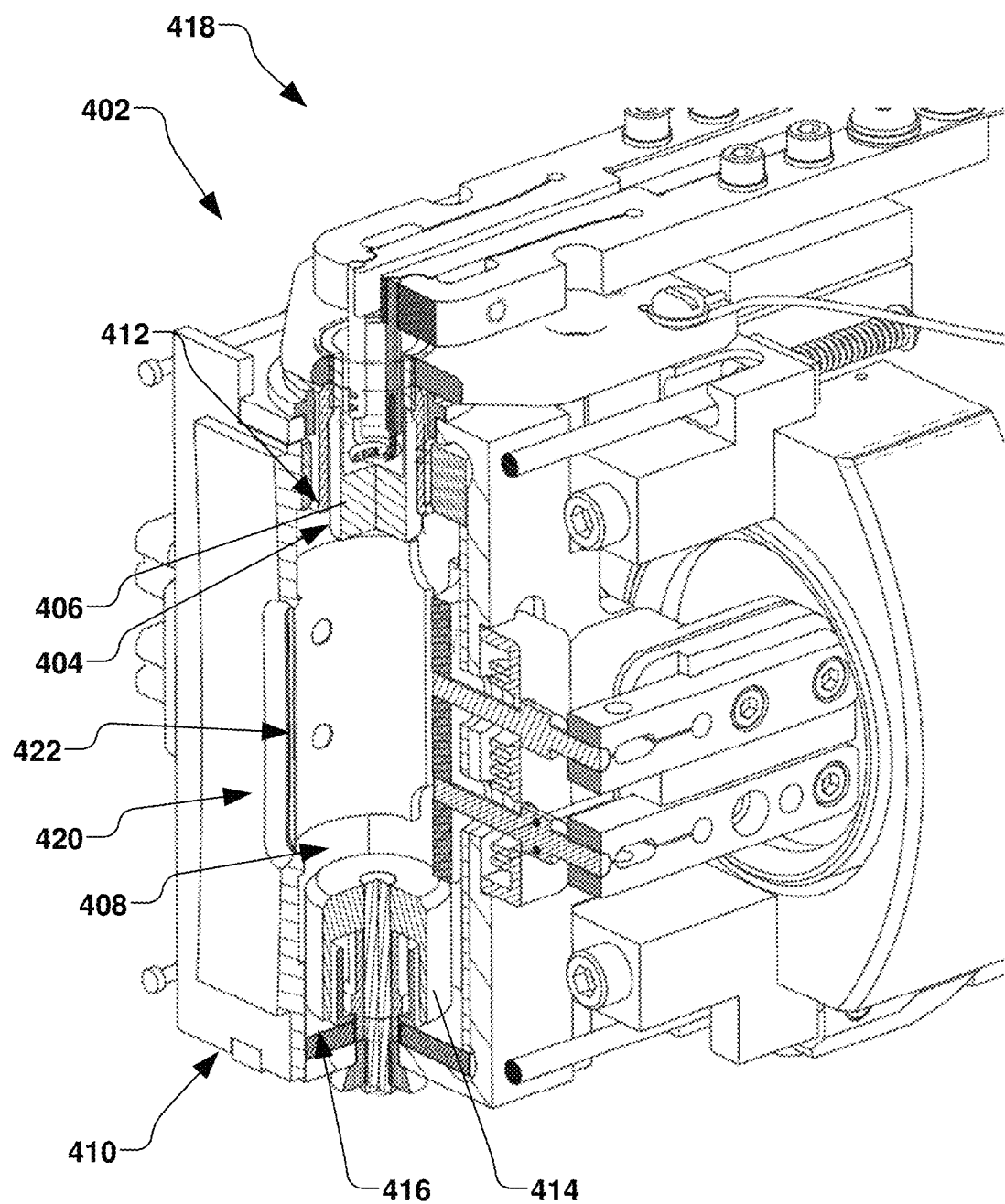
FIG. 5 illustrates a partial perspective cross sectional perspective view of the ion source of FIG. 4.

FIG. 5 illustrates a blown-up portion 418 of the arc chamber 410 of the IHC ion source 400 of FIG. 4, wherein various aspects are illustrated in greater detail. As illustrated in FIG. 5, for example, an aperture plate 420 is operably coupled to the arc chamber 410, therein generally enclosing the chamber volume 408. The aperture plate 420, in the present example, comprises an extraction aperture 422 disposed between the first end 412 and second end 416 of the arc chamber 410. In the present example, the extraction aperture 422 of the aperture plate 420 is configured to provide an elongate ion beam (not shown), however, other shapes of the extraction aperture are also contemplated as falling within the scope of the present disclosure. Further, various suppression and ground electrodes (not shown) may be provided for extraction of the ion beam from the arc chamber 410 while the arc chamber is maintained at a positive terminal potential.

Figure 6:
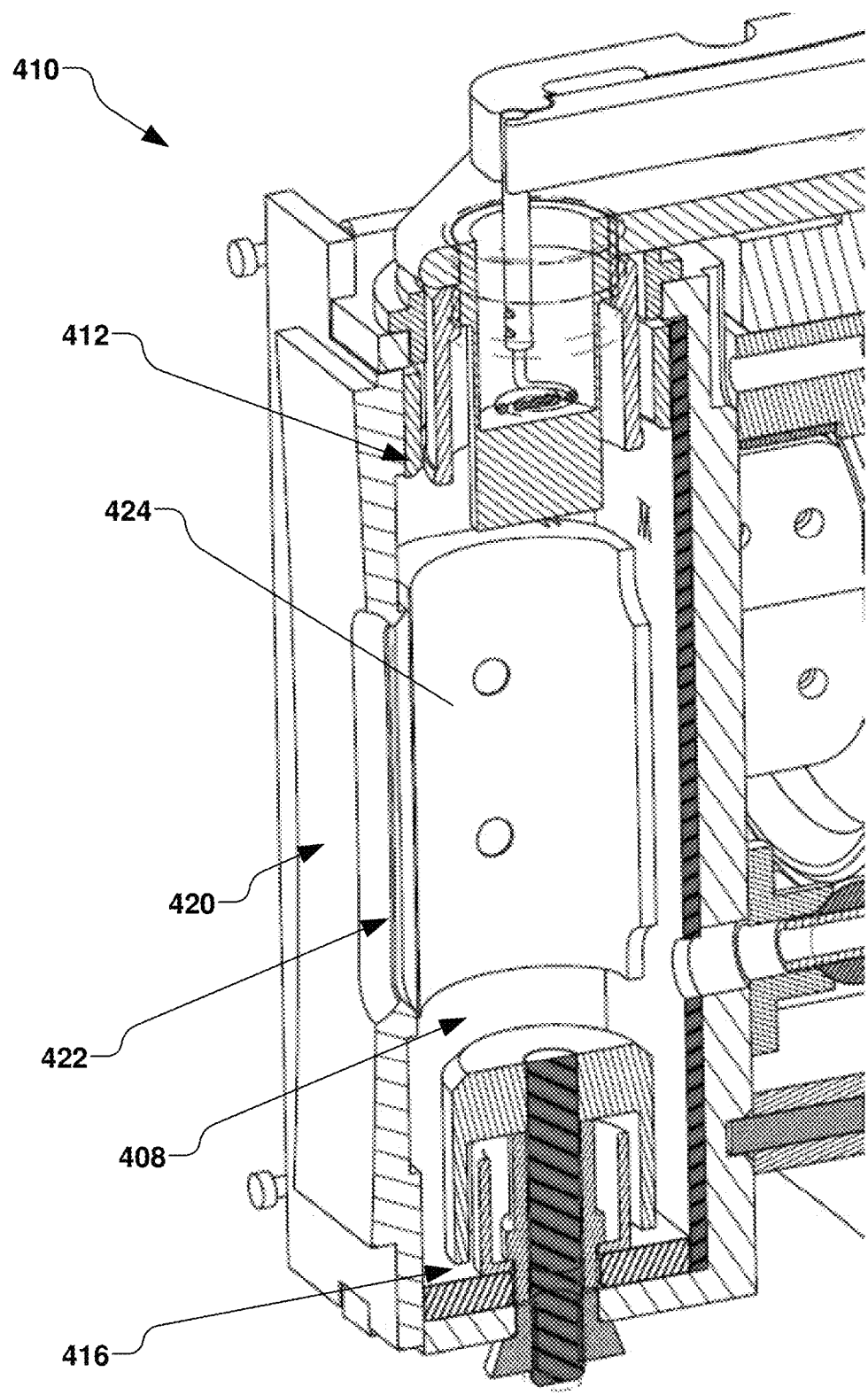
FIG. 6 illustrates a perspective cross sectional side view of an arc chamber in accordance with various aspects of the present disclosure.
Figure 7:
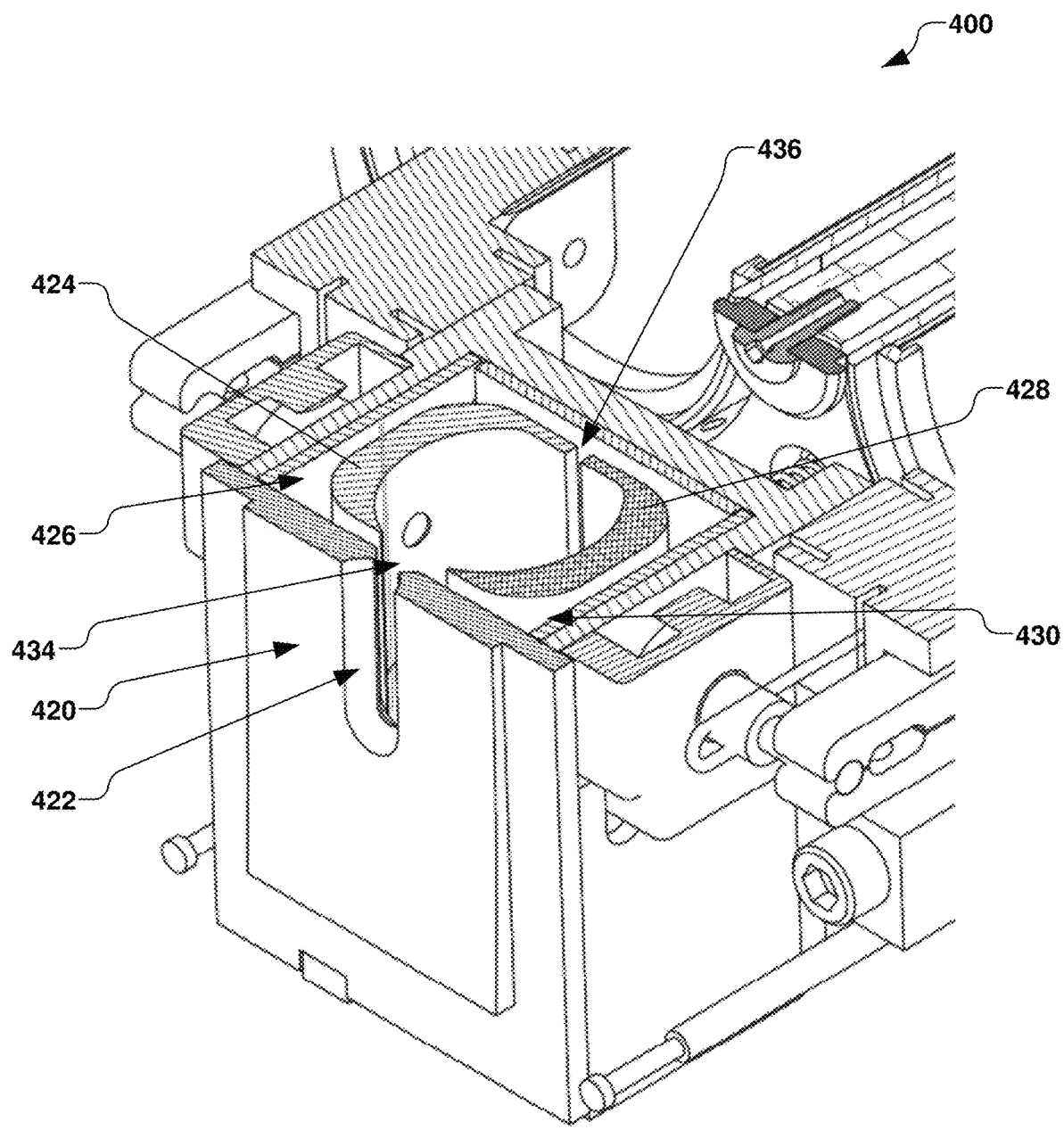
FIG. 7 illustrates a perspective cross sectional top view of an exemplary arc chamber in accordance with various aspects of the present disclosure.

A first bias electrode 424 is disposed within the chamber volume 408 on a first side 426 of the extraction aperture 422, as further illustrated in FIGS. 6 and 7. As illustrated in FIG. 7, for example, the first bias electrode 424 is generally U-shaped when viewed from the first end 412 of the arc chamber 410 of FIG. 6. As illustrated in FIG. 7, a second bias electrode 428, for example, is further disposed within the chamber volume 408 on a second side 430 of the extraction aperture 422, wherein the second bias electrode is also generally U-shaped when viewed from the first end 412 of the arc chamber 410 of FIG. 6. The present disclosure appreciates that while the U-shaped first and second bias electrodes 424, 428 are illustrated, various other arcuate, angular, or otherwise U-shaped arrangement is contemplated as falling within the scope of the present disclosure.

Figure 8:
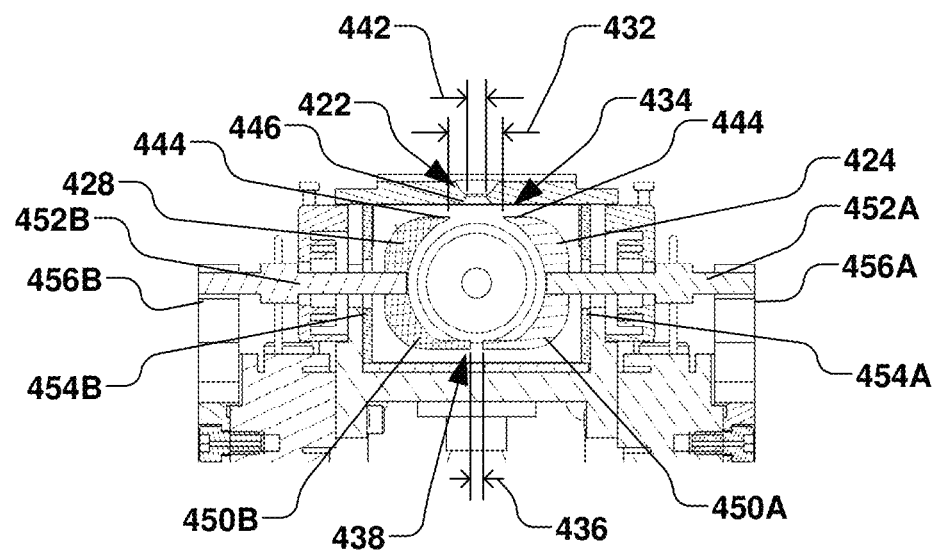
FIG. 8 illustrates a cross sectional plan view of an exemplary arc chamber in accordance with various aspects of the present disclosure.

The first and second bias electrodes 424, 428, for example, are separated by a first distance 432 in a first region 434 proximate to the extraction aperture 422, as illustrated in FIG. 8. Further, the first and second bias electrodes 424, 428, for example are separated by a second distance 436 in a second region 438 distal from the extraction aperture 422. The electrode power supply 220 of FIG. 2A, for example, may be electrically coupled to the first bias electrode 424 and second bias electrode 428 of FIG. 8, for example, wherein the electrode power supply is configured to provide the first positive voltage 224A to the first bias electrode and the second positive voltage 224B to the second bias electrode, wherein the second positive voltage differs from the first positive voltage by a predetermined bias differential, as discussed above.

Figure 9:
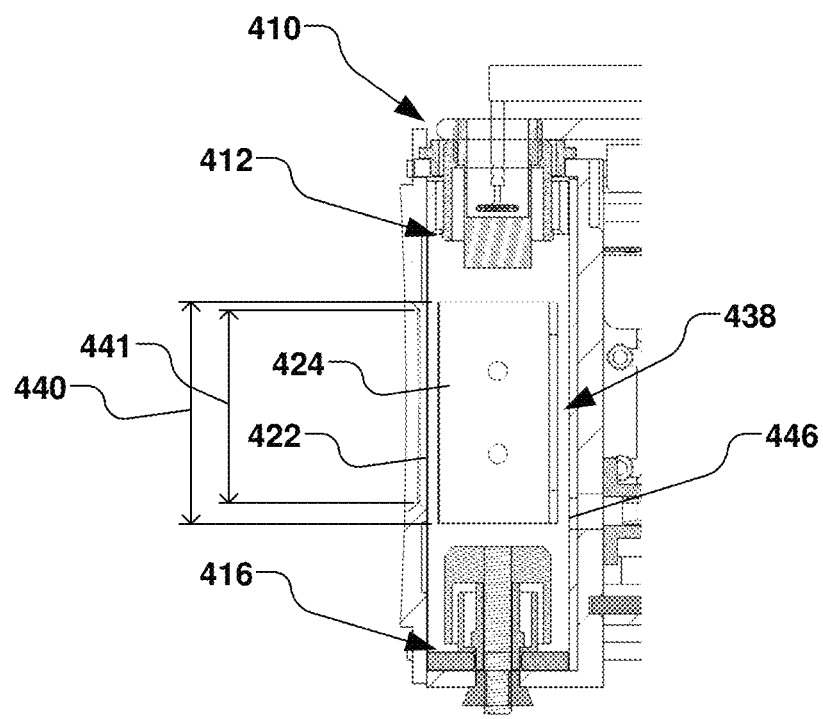
FIG. 9 illustrates a cross sectional plan elevation of an exemplary arc chamber in accordance with various aspects of the present disclosure.

The first and second bias electrodes 424, 428, for example, extend a predetermined length 440 between respective locations proximate to the first and second ends 412, 416 of the arc chamber 410, as illustrated in FIG. 9. The predetermined length 440, for example, is longer than a length 441 of the extraction aperture 422.

In accordance with another example, the first distance 432 shown in FIG. 8 is greater (e.g., approximately twice) than the second distance 436. The first distance 432, for example, is greater than a width 442 of the extraction aperture. In one example, each of the first and second bias electrodes 424, 428 comprise a respective bevel 444 defining the first distance 432, wherein each bevel is associated with a line (not shown) extending from a respective proximate edge 446 of the extraction aperture 422 toward the respective first and second electrodes.

The present disclosure further contemplates the arc chamber 410 further comprising a gas hole 446 defined in a wall 448 thereof, wherein the gas hole is positioned between the first and second ends 412, 416 of the arc chamber 410, as illustrated in FIG. 9. The gas hole 446, in one example, is proximate to the second region 438, and wherein the gas hole may be fluidly coupled to a gas source (not shown) for providing a source gas to the arc chamber 410.

In another example, each of the first bias electrode 424 and second bias electrode 428 illustrated in FIG. 8 respectively comprise a plate 450A, 450B supported by one or more rods 452A, 452B extending through a wall 454 of the arc chamber 410. The one or more rods 452A, 452B, for example, are clamped to a respective electrode clamp 456A, 456B, wherein the respective clamp, one or more rods, and plate 450A, 450B are electrically insulated from the arc chamber 410.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion source, comprising:
   an arc chamber having a first end and a second end opposite the first end;
   an aperture plate operably coupled to the arc chamber, therein generally enclosing a chamber volume, wherein the aperture plate comprises an extraction aperture disposed between the first and second ends of the arc chamber;
   a cathode disposed within the chamber volume proximate to the first end of the arc chamber;
   a repeller disposed within the chamber volume proximate to the second end of the arc chamber;
   a first bias electrode disposed within the chamber volume on a first side of the extraction aperture, wherein the first bias electrode is generally U-shaped when viewed from the first end;
   a second bias electrode disposed within the chamber volume on a second side of the extraction aperture, wherein the second bias electrode is generally U-shaped when viewed from the first end, wherein the first and second bias electrodes are separated by a first distance in a first region proximate to the extraction aperture, and wherein the first and second bias electrodes are separated by a second distance in a second region distal from the extraction aperture; and
   an electrode power supply electrically coupled to the first bias electrode and second bias electrode and configured to provide a first positive voltage to the first bias electrode and a second positive voltage to the second bias electrode, wherein the second positive voltage differs from the first positive voltage by a predetermined bias differential.

2. The ion source of claim 1, wherein the first and second bias electrodes extend a predetermined length between respective locations proximate to the first and second ends of the arc chamber.

3. The ion source of claim 1, wherein the first and second bias electrodes have an arcuate shape when viewed from the first end of the arc chamber.

4. The ion source of claim 1, wherein the first distance is greater than the second distance.

5. The ion source of claim 4, wherein the first distance is approximately twice the second distance.

6. The ion source of claim 4, wherein the first distance is greater than a width of the extraction aperture.

7. The ion source of claim 1, wherein each of the first and second bias electrodes comprise a respective bevel defining the first distance, wherein each bevel is associated with a line extending from a respective proximate edge of the extraction aperture toward the respective first and second electrodes.

8. The ion source of claim 1, wherein the arc chamber further comprises a gas hole defined in a wall thereof, wherein the gas hole is positioned between the first and second ends of the arc chamber proximate to the second region, and wherein the gas hole is fluidly coupled to a gas source.

9. The ion source of claim 1, wherein the predetermined bias differential is on the order of approximately 10 volts.

10. The ion source of claim 1, wherein the electrode power supply comprises a first power supply and a second power supply, wherein the first power supply is configured to provide the first positive voltage to the first bias electrode and the second power supply is configured to provide the second positive voltage to the second bias electrode.

11. The ion source of claim 1, further comprising a resistive element, wherein the resistive element is electrically coupled between the electrode power supply and the second bias electrode, wherein a resistance of the resistive element defines the predetermined bias differential.

12. The ion source of claim 11, wherein the resistive element comprises a variable resistor having a selectively variable resistance.

13. The ion source of claim 1, wherein each of the first bias electrode and second bias electrode respectively comprise a plate supported by one or more rods extending through a wall of the arc chamber and clamped to a respective electrode clamp, wherein the respective clamp, one or more rods, and plate are electrically insulated from the arc chamber.

14. The ion source of claim 1, wherein the cathode comprises an indirectly heated cathode comprising a heater filament and a cap, wherein the heater filament is electrically coupled to a heater power supply configured to selectively energize and heat the cap.

15. An ion source comprising:
   an arc chamber having a first arc chamber wall extending from a first end of the arc chamber to a second end of the arc chamber, wherein the first arc chamber wall has an extraction aperture defined therein that is positioned between the first and second ends of the arc chamber;
   an indirectly heated cathode disposed proximate to the first end of the arc chamber, wherein the indirectly heated cathode comprises heater filament and cap, and wherein the heater filament is configured to receive electrical power to heat the cap;
   a first bias electrode disposed between the first and second ends of the arc chamber on a first side of the extraction aperture, wherein the first bias electrode is generally U-shaped when viewed from the first end; and
   a second bias electrode disposed between the first and second ends of the arc chamber on a second side of the extraction aperture, wherein the second bias electrode is generally U-shaped when viewed from the first end; and a resistive element, associated with one or more of the first bias electrode and the second bias electrode, wherein a resistance of the resistive element defines a predetermined bias differential between the first bias electrode and second bias electrode.

16. The ion source of claim 15, wherein the first bias electrode and second bias electrode are separated by a first distance in a first region proximate to the extraction aperture, and wherein the first bias electrode and second bias electrode are separated by a second distance in a second region distal from the extraction aperture, wherein the first distance is greater than the second distance.

17. The ion source of claim 15, further comprising an electrode power supply electrically coupled to the first bias electrode and second bias electrode and configured to provide a first positive voltage to the first bias electrode and a second positive voltage to the second bias electrode, wherein the second positive voltage differs from the first positive voltage by the predetermined bias differential.

18. The ion source of claim 17, wherein the electrode power supply comprises a first power supply and a second power supply, wherein the first power supply is configured to provide the first positive voltage to the first bias electrode and the second power supply is configured to provide the second positive voltage to the second bias electrode, and wherein the predetermined bias differential is on the order of approximately 10 volts.

19. The ion source of claim 17, wherein the resistive element is electrically coupled between the electrode power supply and the second bias electrode.

20. A method for increasing a beam current in an indirectly heated cathode (IHC) ion source, the method comprising:

electrically biasing an indirectly heated cathode disposed within an arc chamber, wherein the indirectly heated cathode is biased with respect to opposing first and second arc chamber walls, and wherein the first arc chamber wall comprises an extraction aperture positioned between first and second ends of the arc chamber;

electrically biasing a first bias electrode with respect to a second bias electrode by a predetermined bias differential, wherein the first and second bias electrodes are disposed between the first and second ends of the arc chamber and are separated by a first gap proximate to the first arc chamber wall and a second gap proximate to the second arc chamber wall; and extracting an ion beam through the extraction aperture, wherein the predetermined bias differential increases the beam current of the ion beam.

* * * * *